United States Patent
Hong et al.

(10) Patent No.: US 11,211,493 B2
(45) Date of Patent: Dec. 28, 2021

(54) APPARATUS AND METHOD OF MODULATING THRESHOLD VOLTAGE FOR FIN FIELD EFFECT TRANSISTOR (FINFET) AND NANOSHEET FET

(71) Applicant: Samsung Electronics Co., Ltd., Gyeonggi-do (KR)

(72) Inventors: Joon Goo Hong, Austin, TX (US); Mark Rodder, Dallas, TX (US)

(73) Assignee: Samsung Electronics Co., Ltd.

( * ) Notice: Subject to any disclaimer, the term of this patent is extended or adjusted under 35 U.S.C. 154(b) by 9 days.

(21) Appl. No.: 16/577,815

(22) Filed: Sep. 20, 2019

(65) Prior Publication Data

US 2020/0403093 A1 Dec. 24, 2020

Related U.S. Application Data

(60) Provisional application No. 62/863,056, filed on Jun. 18, 2019.

(51) Int. Cl.
| | | |
|---|---|---|
| *H01L 27/088* | (2006.01) | |
| *H01L 29/78* | (2006.01) | |
| *H01L 29/06* | (2006.01) | |
| *H01L 21/8234* | (2006.01) | |
| *H01L 21/66* | (2006.01) | |
| *H01L 29/66* | (2006.01) | |

(52) U.S. Cl.
CPC .... *H01L 29/785* (2013.01); *H01L 21/823431* (2013.01); *H01L 22/12* (2013.01); *H01L 27/0886* (2013.01); *H01L 29/0665* (2013.01); *H01L 29/66795* (2013.01)

(58) Field of Classification Search
CPC ............ H01L 27/0886; H01L 27/0924; H01L 27/1211
See application file for complete search history.

(56) References Cited

U.S. PATENT DOCUMENTS

| | | |
|---|---|---|
| 6,686,300 B2 | 2/2004 | Mehrotra et al. |
| 10,090,193 B1 | 10/2018 | Chanemougame et al. |
| 10,170,304 B1 | 1/2019 | Kwon et al. |
| 2015/0083999 A1 | 3/2015 | Cheng et al. |
| 2015/0084129 A1 | 3/2015 | Lee et al. |

(Continued)

FOREIGN PATENT DOCUMENTS

| | | |
|---|---|---|
| WO | WO 2018/111247 | 6/2018 |
| WO | WO 2018/111311 | 6/2018 |
| WO | WO 2019/040071 | 2/2019 |

*Primary Examiner* — Cuong Q Nguyen
*Assistant Examiner* — Peter M Albrecht
(74) *Attorney, Agent, or Firm* — The Farrell Law Firm, P.C.

(57) ABSTRACT

Apparatus and method are provided. The apparatus includes at least one field effect transistor (FET), wherein the at least one FET comprises at least one gate overlaying at least one non-linear fin, wherein the non-linear fin is formed via modulating a mandrel by producing cut-outs in the mandrel via optical proximity correction (OPC). The method includes receiving a semiconductor wafer, forming source and drain areas for each of at least one FET on the semiconductor wafer; and forming at least one gate overlaying at least one non-linear fin in each of the at least one FET, wherein the non-linear fin is formed via modulating a mandrel by producing cut-outs in the mandrel via OPC.

6 Claims, 8 Drawing Sheets

(56) References Cited

U.S. PATENT DOCUMENTS

| | | | |
|---|---|---|---|
| 2016/0056295 A1* | 2/2016 | Wen | H01L 29/7851 |
| | | | 257/369 |
| 2017/0098709 A1* | 4/2017 | Dias | H01L 21/845 |
| 2017/0323824 A1 | 11/2017 | Chang et al. | |
| 2018/0219064 A1 | 8/2018 | Cheng et al. | |
| 2019/0067442 A1 | 2/2019 | Lin et al. | |
| 2019/0081168 A1* | 3/2019 | Yu | H01L 29/66795 |
| 2020/0066595 A1* | 2/2020 | Glass | H01L 27/1211 |

* cited by examiner

APPARATUS AND METHOD OF MODULATING THRESHOLD VOLTAGE FOR FIN FIELD EFFECT TRANSISTOR (FINFET) AND NANOSHEET FET

PRIORITY

This application claims priority under 35 U.S.C. § 119(e) to a U.S. Provisional Patent Applications filed on Jun. 18, 2019 in the United States Patent and Trademark Office and assigned Ser. No. 62/863,056, the entire contents of which are incorporated herein by reference.

FIELD

The present disclosure relates generally to device fabrication, and more particularly, to an apparatus and method of modulating a threshold voltage for a fin field effect transistor (FinFET) and nanosheet FET.

BACKGROUND

Semiconductor fabrication processes with multiple work function metal depositions and patterning, with device scaling are complex.

SUMMARY

According to one embodiment, an apparatus is provided. The apparatus includes at least one FET, wherein the at least one FET includes at least one gate overlaying at least one non-linear fin, wherein the at least one non-linear fin is formed via modulating a mandrel by producing cut-outs in the mandrel via optical proximity correction (OPC).

According to one embodiment, a method is provided. The method includes receiving a semiconductor wafer, and forming source and drain areas for each at least one FET on the semiconductor wafer, and forming at least one gate overlaying at least one non-linear fin in each of the at least one FET, wherein the non-linear fin is formed via modulating a mandrel by producing cut-outs in the mandrel via OPC.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1A:
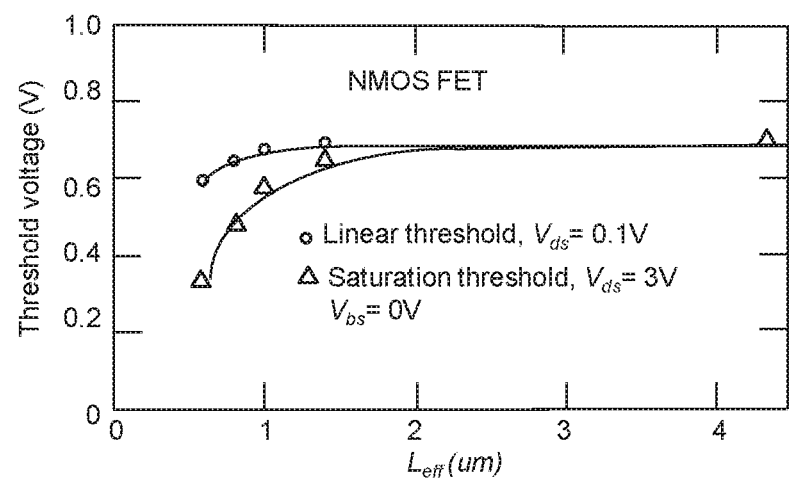
FIG. 1A is a chart of threshold voltage versus effective length of a gate of an n-channel metal oxide semiconductor (NMOS) FET.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

FIG. 1A is a chart of threshold voltage versus effective length of a gate of an NMOS FET.

Referring to FIG. 1A, channel length and threshold voltage are related. A conventional method of modulating threshold voltage (Vt) is by gate length scaling with pitch scaling.

In addition, device current and its relationship with Vt and gate sizes may be expressed as in Equation (1) below.

$$I_{ds} = \frac{W}{L}\mu C_{ox}\left(V_{gs} - \frac{V_{ds}}{2} - V_t\right)V_{ds} \text{ for } Vds < Vgs - Vt \quad (1)$$

Figure 1B:
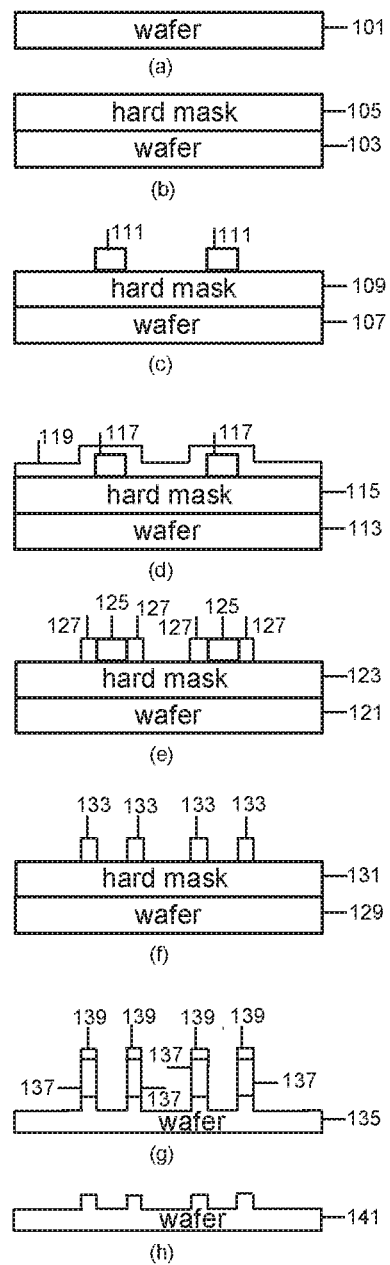
FIG. 1B is an illustration of a self-aligned double patterning (SADP) process.

FIG. 1B is an illustration of an SADP process.

Referring to FIG. 1B, in panel (a), a semiconductor wafer 101 is received. In panel (b), a hard-mask layer 105 is deposited on the semiconductor wafer 103. In panel (c), a photo resist, or an organic material, layer 111 (also referred to as a mandrel-patterning mask layer) is deposited on the hard-mask layer 109, where the hard-mask layer 109 is on the semiconductor wafer 107.

In panel (d), a spacer layer 119 is deposited around the periphery of the mandrel-patterning mask layer 117, where the mandrel-patterning mask layer 117 is on the hard-mask layer 115, and the hard-mask layer 115 is on the semiconductor wafer 113. The spacer layer 119 may be deposited on all, or most of, the surface of the combination of layers illustrated in panel (d). In panel (e), the spacer layer 119 of panel (d) is etched to reveal a combination of layers including the semiconductor wafer 121, the hard-mask layer 123 on the semiconductor layer 123, the mandrel-patterning mask layer 125 on the hard-mask layer 123, and a portion of the spacer layer 127 remaining on sidewalls of the mandrel-patterning mask layer 125. In panel (f), the mandrel-patterning mask layer 125 in panel (e) is etched, leaving only the portion of the spacer layer 133 that was on the sidewalls of the mandrel-patterning mask layer 125 in panel (d). In panel (g), the spacer layer 133, the hard-mask layer 131, and the semiconductor wafer 129 of panel (f) are etched to leave a portion of the spacer layer 139 on the hard-mask layer 137 that is patterned, and the semiconductor wafer 135 that is etched to form mandrels therein. In panel (h), the spacer layer 139 and the patterned hard-mask layer 137 of panel (g) are etched to reveal the features etched into the semiconductor wafer 141. The overall result of the SADP process is features that are located with a much smaller pitch than the mandrel-patterning mask layer 111 in panel (c).

OPC is a photolithography enhancement technique commonly used to compensate for image errors due to diffraction or process effects. Specifically, near the limit of diffraction, patterning specific shapes becomes difficult, and features can be distorted. OPC corrects these errors by moving pattern edges or adding extra polygons to a pattern on a photomask to compensate. These features are added using pre-computed look-up tables based on width and spacing between desired features (e.g., rule based OPC) or by using compact models to dynamically simulate a final pattern and thereby move edges, or add polygons on the mask to achieve desired pattern result (e.g., model based OPC). Other OPC methods may be available.

Figure 2:
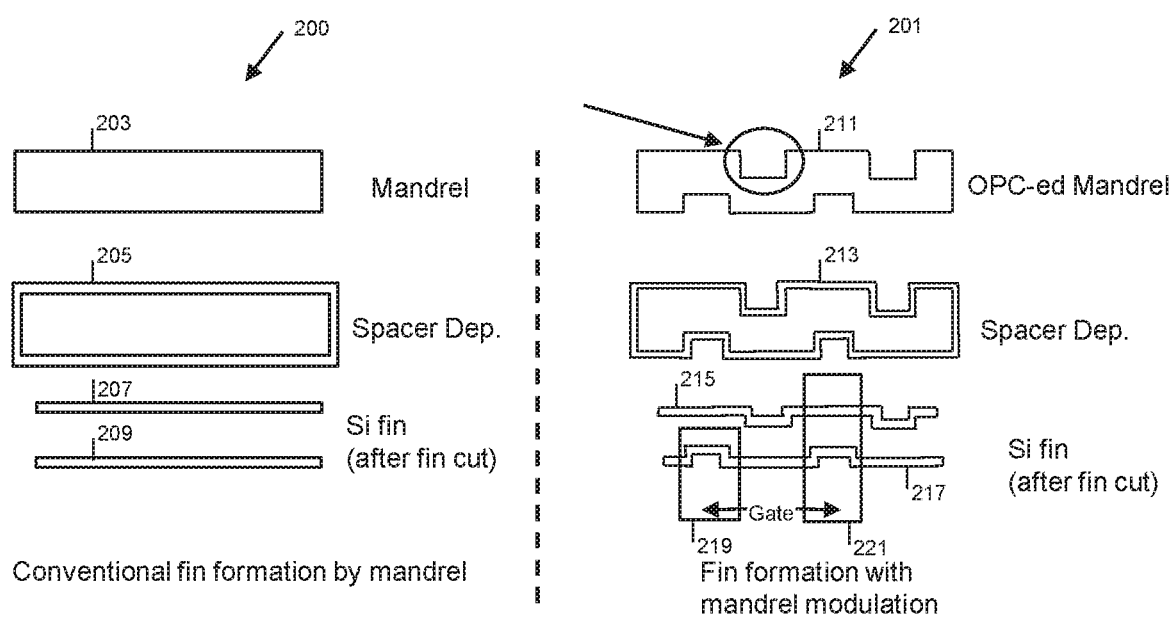
FIG. 2 is an illustration comparing conventional fin formation and fin formation according to an embodiment.

FIG. 2 is an illustration comparing conventional fin formation 200, and fin formation according to an embodiment of the present disclosure 201.

With Regard to FIG. 2, herein, it is realized that OPC may be used for purposes other than simply ensuring that photolithographic errors in a desired pattern are minimized. Specifically, it is realized that OPC may be used to intentionally modify the final shape of the SADP mandrel 211, which ultimately results in very fine grained modifications to the fin shapes 215 and 217 so that fins having other than "straight line" shape may be made. By carefully modifying the fin shapes 215 and 217, a channel length defined by the fin length is modulated under a gate. The benefit of modifying the shape of the mandrel 211 by OPC and, thus, modifying the lengths of the fins 215 and 217 is that a threshold voltage Vt can be modified, since Vt depends on the channel length defined by the length of the fin. Another benefit is that a source-drain leakage current may also be controlled, which enables fabrication of a wimpy device. Within a limited gate length, the channel length modulation provides a way to modify Vt and leakage current. The present disclosure discloses how to exert fine control over increases in channel length by making, for example, an omega-shaped fin through OPC at the fin mandrel.

Referring to FIG. 2, a rectangular mandrel 203 is formed on a semiconductor wafer, as part of an SADP process in the conventional fin formation 200 process. In addition, an irregularly shaped mandrel 211 (e.g., a rectangular mandrel with at least one omega-shaped indentation formed therein by OPC) is formed on a semiconductor wafer using an SADP process in the fin formation 201 process of an embodiment of the present disclosure.

A spacer layer 205 is formed around the mandrel 203 using the SADP process in the conventional fin formation 200 process. In addition, a spacer layer 213 is formed around the mandrel 211 using the SADP process in the fin formation 201 process of an embodiment of the present disclosure.

Straight fins 207 and 209 result from the conventional fin formation 200 process, while modified-shaped fins 215 and 217 that mirror the modified shape of the mandrel 211 result from the fin formation 201 process of an embodiment of the present disclosure. Gates 219 and 221 may be formed over portions of the irregularly shaped fins 215 and 217, where the lengths of the gates 219 and 221 are longer than if straight fins were formed in the gates 219 and 221 due to the added length within the gates 219 and 221 of the irregular shapes of the fins 215 and 217 as compared to gates that use the straight fins 207 and 209.

In the conventional FinFET device fabrication process 200, a straight fin 207 and 209 is produced. In the present disclosure, an omega-shaped fin 217 is produced, where the effective length of a given linear length of the omega-shaped fin 217 is longer than the same linear length of a straight fin, due to the added length provided by the omega shape. More than one omega shape may be fabricated in a fin (e.g., fin 217), and the omega shape may be in more than one orientation in different fins or within the same fin.

The semiconductor structure may have many shapes of fins including an omega shape, where OPC is used to modulate the shape of the fins. Fins with different shapes (generally curves) have different effective lengths due to the modulations (e.g., curves). These lengths allow for selective tuning of Vt/leakage per gate. An omega shape includes vertical and lateral segments, and a radius of a curvature of the corner of the vertical and lateral segments, where the radius of curvature is a certain value, and where the value is associated with a certain channel length.

The vertical segments can have different lengths for different FETs, to enable different channel lengths such as a longer channel length to achieve a different Vt or a different leakage current, as compared to a semiconductor structure not having the omega-shaped fin, where the Vt for the longer omega-shaped channel is higher in magnitude than for a straight fin, and the leakage current for the longer omega-shaped channel is lower in magnitude than for a straight fin.

The multiple fins with various shapes may include at least one fin having an omega shape. The multiple fins with various shapes may include at least two fins having an omega shape. The at least two fins having an omega shape may be formed by a first mandrel using and a second mandrel using OPC, where the second mandrel may be in an orientation that is flipped 180 degrees as compared to the first mandrel (or where the second mandrel may be another type of variation of the first mandrel), where the at least two fins may share a same gate electrode, and where the at least two fins may be adjacent to each other. In addition, the at least two fins having an omega shape may be formed by a first mandrel and a second mandrel using OPC, where the second mandrel may be in an orientation that is in the same orientation (e.g., not flipped 180 degrees) as compared to the first mandrel (or where the second mandrel may be another type of variation of the first mandrel), where the at least two fins may share a same gate electrode, and where the at least two fins may not be adjacent to each other.

The semiconductor structure may have multiple fins including at least one fin having an omega shape, and at least a second fin having a conventional straight-line shape, where the multiple fins have an effective Vt (and leakage current) that is in-between the Vt (and leakage current) of just one fin having an omega shape and just one fin having a conventional straight-line shape.

The present disclosure is described for Si fin shape modulation which includes FinFET. The present disclosure also applies to a nanosheet FET, where at least one nanosheet channel is modulated by OPC similarly to how an Si fin is modulated by OPC.

In FIG. 2, a first gate 219 and a second gate 221 are fabricated, where the first gate 219 overlays one fin and the second gate 219 overlays two fins, and where the first gate 219 overlays one omega-shaped fin and the second gate 221 overlays a straight fin and an omega-shaped fin, and where the omega-shaped fins in the first gate 219 and the second gate 221 are in the same orientation.

Figure 3:
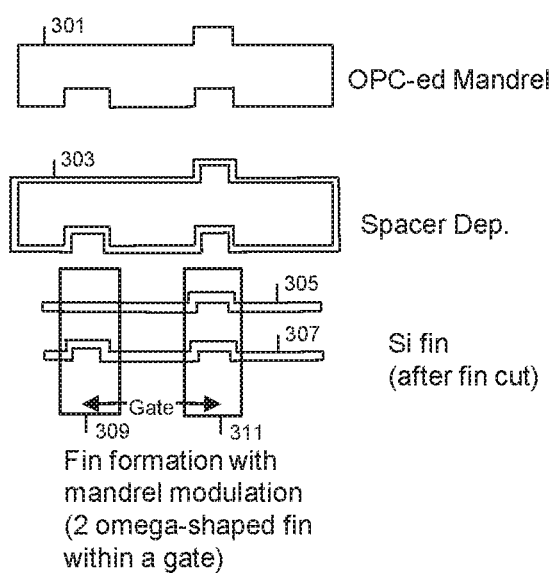
FIG. 3 is an illustration of fin formation, according to an embodiment.

FIG. 3 is an illustration of fin formation, according to an embodiment.

Referring to FIG. 3, a mandrel 301 is formed that includes 3 omega shapes formed therein by OPC for producing one straight fin and three omega-shaped fins. However, the present disclosure is not limited to using 3 omega shapes and any number of omega shapes may be used. For example, one of the omega shapes extends outward from a first side of the mandrel 301 and two omega shapes extend into a second side of the mandrel 301.

The mandrel 301 is then covered with a spacer deposition layer 303. The spacer deposition layer 303 is then etched to leave residuals on each side of the mandrel 301.

A first fin 305 and a second fin 307 are formed using the mandrel 301 and the spacer deposition layer 303. A first gate 309 and a second gate 311 are formed over the first fin 305 and the second fin 307. The first gate 309 overlays a straight-line fin and an omega-shaped fin. The second gate 311 overlays two omega-shaped fins in the same orientation.

Figure 4:
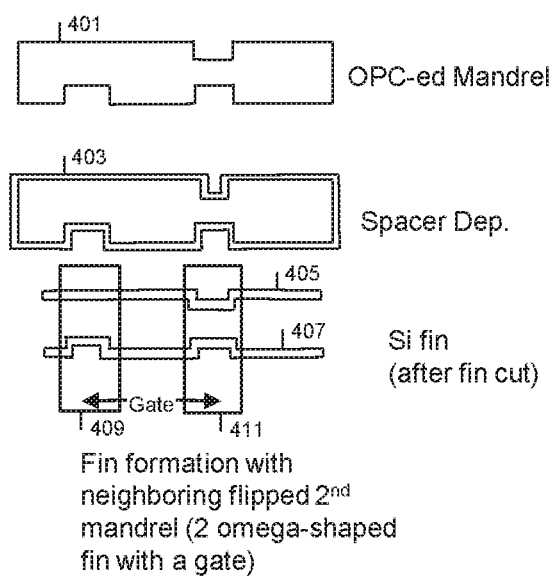
FIG. 4 is an illustration of fin formation, according to an embodiment.

FIG. 4 is an illustration of fin formation, according to an embodiment.

Referring to FIG. 4, a mandrel 401 is formed that includes more than one (e.g., 3) omega shape formed therein by OPC for producing one straight fin and three omega-shaped fins. For example, one of the omega shapes extends into a first side of the mandrel 401 and two omega shapes extend into a second side of the mandrel 401.

The mandrel 401 is then covered with a spacer deposition layer 403. The spacer deposition layer 403 is then etched to leave residuals on each side of the mandrel 401.

A first fin 405 and a second fin 407 are formed using the mandrel 401 and the spacer deposition layer 403. A first gate 409 and a second gate 411 are formed over the first fin 405 and the second fin 407. The first gate 409 overlays a straight-line fin and an omega-shaped fin. The second gate 411 overlays two omega-shaped fins in opposite orientations.

Figure 5:
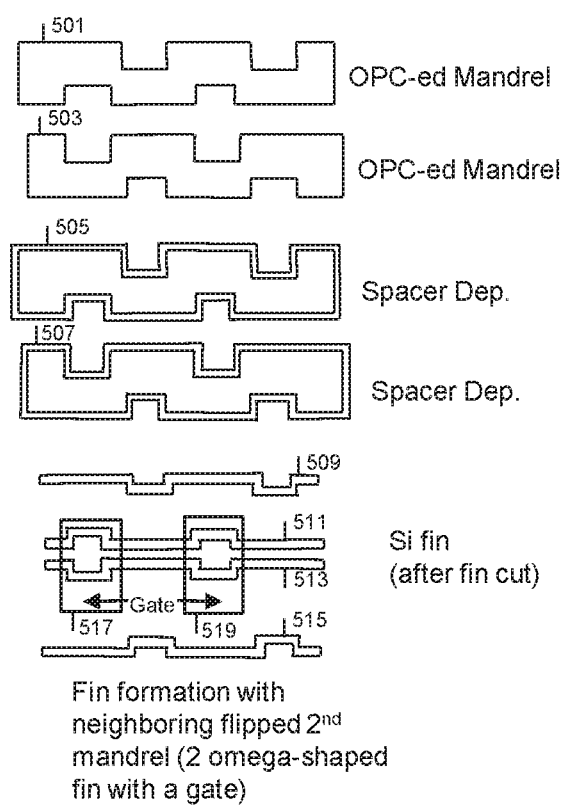
FIG. 5 is an illustration of fin formation, according to an embodiment.

FIG. 5 is an illustration of fin formation, according to an embodiment.

Referring to FIG. 5, a first mandrel 501 is formed that includes more than one (e.g., 4) omega shape formed therein by OPC for producing four omega-shaped fins. For example, two of the omega shapes extend into a first side of the mandrel 501 and two omega shapes extend into a second side of the mandrel 501. A second mandrel 503 may be formed adjacent to the first mandrel 501 in a same method as the first mandrel 501 is formed but in an orientation flipped vertically with respect to the first mandrel 501.

The first mandrel 501 is then covered with a first spacer deposition layer 505, and the second mandrel 503 is then covered with a second spacer deposition layer 507. The first spacer deposition layer 505 is then etched to leave residuals on each side of the first mandrel 501, and the second spacer deposition layer 507 is then etched to leave residuals on each side of the second mandrel 503.

A first fin 509 and a second fin 511 are formed using the first mandrel 501 and the first spacer deposition layer 505. A third fin 513 and a fourth fin 515 are formed using the second mandrel 503 and the second spacer deposition layer 507. A first gate 517 and a second gate 519 are formed over the second fin 511 and the third fin 513. The first gate 517 overlays two omega-shaped fins in opposite orientations. The second gate 519 overlays two omega-shaped fins in opposite orientations, but in the same orientation as in the first gate 517. Thus, a gate may be constructed using two adjacent mandrels, rather than the sides of a single mandrel.

Figure 6:
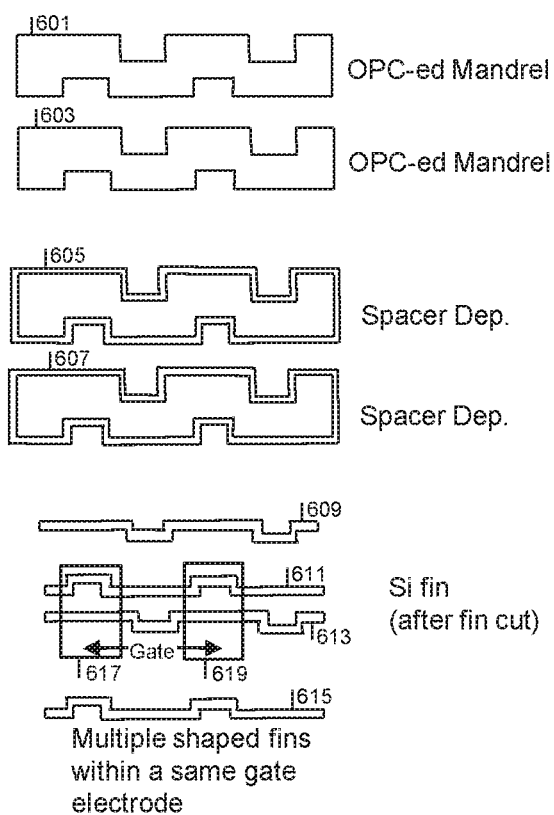
FIG. 6 is an illustration of fin formation, according to an embodiment.

FIG. 6 is an illustration of fin formation, according to an embodiment.

Referring to FIG. 6, a first mandrel 601 is formed that includes more than one (e.g., 4) omega shape formed therein by OPC for producing four omega-shaped fins. For example, two of the omega shapes extend into a first side of the mandrel 601 and two omega shapes extend into a second side of the mandrel 601. A second mandrel 603 may be formed adjacent to the first mandrel 601 in a same method as the first mandrel 601 is formed and in a same orientation with respect to the first mandrel 601.

The first mandrel 601 is then covered with a first spacer deposition layer 605, and the second mandrel 603 is then covered with a second spacer deposition layer 607. The first spacer deposition layer 605 is then etched to leave residuals on each side of the first mandrel 601, and the second spacer deposition layer 607 is then etched to leave residuals on each side of the second mandrel 603.

A first fin 609 and a second fin 611 are formed using the first mandrel 601 and the first spacer deposition layer 605. A third fin 613 and a fourth fin 615 are formed using the second mandrel 603 and the second spacer deposition layer 607. A first gate 617 and a second gate 619 are formed over the second fin 611 and the third fin 613. The first gate 617 overlays one omega-shaped fin and one straight-line fin. The second gate 619 overlays an omega-shaped fin and a straight-line fin in the same orientation as in the first gate 617.

Figure 7:
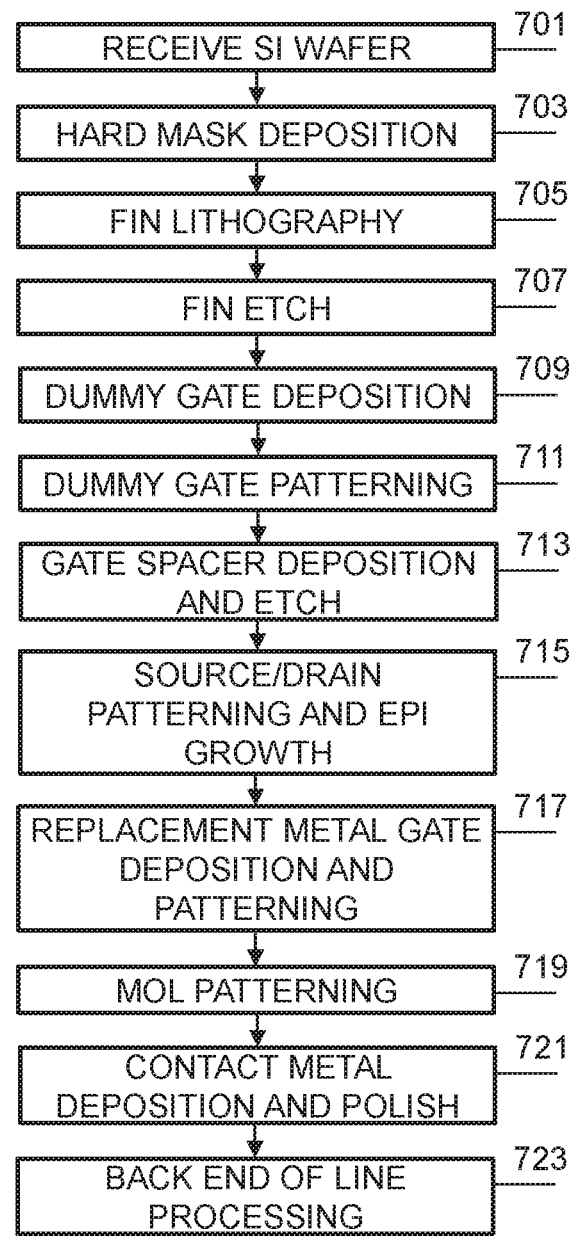
FIG. 7 is a flowchart of a method of fin formation, according to an embodiment.

FIG. 7 is a flowchart of a method of fin formation, according to an embodiment.

Referring to FIG. 7, a wafer (e.g., Si) is received at 701.

The method of fabricating a FinFET device with customizable fin shapes within a gate material includes depositing a hard mask on top of the wafer (e.g., an Si substrate) with dielectric materials at 703. Hard mask and photo resist is deposited for fin mandrel patterning.

At 705, fin lithography is performed on the wafer. A fin mask is modulated by OPC at layout. In an embodiment, a mandrel mask is patterned on the wafer using lithography to define where the fins are located. The mandrel mask shape is modulated by OPC to have various shapes of edge, dielectric material is deposited and etched to have the dielectric material remain only at the sidewall of the mandrel. The mandrel material is etched away and the dielectric material is exposed at the sidewall and at the hard mask on top of the Si substrate.

At 707, a fin is etched. Dry etching may be performed to make a Si fin. Thin (<10 nm) liner dielectric may be deposited, and all trenches may be filled with thick oxide for a standard shallow trench isolation (STI) procedure. Oxide chemical mechanical polish (CMP) may be performed. Unnecessary fins may be removed, and fins may be refined by removing parts of the fins. A recess may be formed in an oxide, a hard mask may be removed, and cleaning may be performed, where a recess in the oxide recess may reveal a fin. In an embodiment, the whole dielectric stack and the Si are etched to make the fin shaped Si. Various fin shapes from a top down image may be obtained. The substrate material may be SiGe. The substrate may be a multiple stack of Si and SiGe. Patterning the mandrel mask may include various curvatures of the mandrel pattern. The mandrel material along with the dielectric material and the hardmask may be etched. The above steps are SADP with sidewall material. However, the present disclosure is not limited thereto. The present disclosure may use self-aligned quadruple patterning (SAQP) with dual mandrel materials.

At 709, a dummy gate oxide is deposited. Thin (e.g., 2-10 nm) dummy oxide and amorphous Si may be deposited. Amorphous Si becomes poly-silicon during an annealing process.

At 711, a dummy gate is patterned. Hard mask and photo resist is deposited for gate patterning, where gate patterning may be either direct patterning or SADP.

At 713, a gate spacer is deposited and the gate spacer is etched. Gate spacer dielectric material (e.g., 5-20 nm) may be deposited and dry etching may be performed.

At 715, the source/drain is patterned and an epitaxial (epi) layer is grown. A thin (e.g., 2-10 nm) nitride layer may be deposited, n-channel/p-channel metal oxide semiconductor (NMOS/PMOS) areas may be patterned, and source/drain epitaxial layers may be grown. Thick oxide may be deposited and oxide CMP may be performed (stop on gate hardmask). A gate cut mask may be patterned and exposed dummy poly silicon may be removed. A dielectric may be deposited and CMP may be performed. Poly silicon deposition, thin dummy oxide removal, interface oxidation, high-k gate oxidation, work-function metal deposition, gate metal (such as tungsten (W), cobalt (Co) and aluminum (Al)) deposition, and CMP may be performed. A dielectric and photo resist for gate and source/drain contact patterning may be deposited.

At 717, replacement metal gate is deposited and patterned.

At 719, middle-of-line (MOL) patterning is performed.

At 721, contact metal is deposited and polished.

At 723, back-end-of-line (BEOL) processing is performed.

The above steps are SADP with sidewall material. However, the present disclosure is not limited thereto and the above steps may be extended to employ SAQP with dual mandrel materials.

The present disclosure provides the following advantages: (1) Si fin (or gate-all-around from Si/silicon germanium (Si/SiGe) stack) channel length may be modulated within the same gate size; (2) various threshold voltages may be achieved depending on the Si fin (or gate-all-around) channel length and shape; (3) multiple work-function metal depositions and patterning may be reduced as compared to a conventional process; and (4) a wimpy device may be made by the same method without any additional patterning steps.

A circuit design-friendly multi-threshold voltage (Vt) option currently requires multiple work function metal deposition and patterning process steps. Since gate length scaling is challenging due to the metal fill capability within a narrow line, the present disclosure provides simpler process steps for reducing multiple gate metal patterning. In addition, a wimpy device may be achieved by the same method without gate length increase.

A semiconductor structure includes a semiconductor device having many possible shapes of fins disposed within a gate material. The semiconductor device has either a single or multiple fins as a channel region. The fins may have either discrete or non-discrete source and drain regions. The fins may consist essentially of silicon, and the semiconductor devices may be NMOS and PMOS devices. The fins may also consist essentially of SiGe, and the semiconductor devices may be PMOS devices.

Multiple fins with various shapes may be formed within a gate. A channel length may be elongated by the use of variously shaped fins. A gate may be filled with metallic materials such as titanium (Ti), titanium nitride (TiN) and tantalum nitride (TaN). In an embodiment, a gate oxide stack may be Si oxide and hafnium oxide. In another embodiment, a gate oxide stack may be Si oxide with either tantalum oxide, titanium oxide or lanthanum oxide. A single gate may contain multiple fins of multiple shapes.

A semiconductor structure may include fins of many different shapes (e.g., an omega shape). An omega shape includes vertical and lateral segments, and a radius of a curvature of the corner of the vertical and lateral segments, where the radius of curvature is a certain value, and where the value is associated with a certain channel length. A fin may be modulated into an omega shape by using OPC on a corresponding fin with different shapes (generally curves) have different lengths. These lengths allow for selectively tuning Vt/leakage per gate.

Vertical segments of a modulated fin may have different lengths for different FETs to enable different channel lengths such as a longer channel length to achieve a different Vt or a different leakage current, as compared to a semiconductor structure not having an omega-shaped fin, where a Vt of a modulated fin is higher in magnitude than an unmodulated fin occupying a same area as the modulated fin, and a leakage current of a modulated fin is lower in magnitude than a leakage current of an unmodulated fin within an equivalent area as the modulated fin.

Multiple fins with various shapes may include at least one fin having an omega shape. Multiple fins with various shapes may also include at least two fins having an omega shape. Multiple fins having an omega shape may be formed using multiple mandrels in multiple orientations (e.g., a first mandrel in a first orientation and a second mandrel having the same patterning as the first mandrel but with its orientation flipped in a vertical direction as compared to the first mandrel). In addition, multiple mandrels may have different patterning. Multiple fins (modulated or not) may be included in a single gate, where fins (modulated or not) may be adjacent to each other. Furthermore, any combination of mandrel patterning and orientation with respect to multiple mandrels may be used and modulated fins within a gate need not be adjacent to each other. That is, a modulated fin may be adjacent to a straight fin.

A semiconductor structure may have multiple fins including at least one fin having an omega shape and at least a one fin having a straight-line shape. A semiconductor structure with multiple fins may have an effective Vt (and leakage current) that is in-between a Vt (and leakage current) of one fin having an omega shape and one fin having a straight-line shape.

The present disclosure is described for Si fin shape modulation which includes FinFET. The present disclosure also applies to a nanosheet FET by modulating the nanosheets in a nanosheet FET in a similar manner as a fin in a FinFET is modulated as described above.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   at least one field effect transistor (FET) comprising:
      a first non-linear fin;
      a second non-linear fin adjacent to and mirroring the first non-linear fin;
      a gate fully overlaying a first omega-shaped portion of the first non-linear fin and fully overlaying a second omega-shaped portion of the second non-linear fin, wherein each of the first and second omega-shaped portions comprise lateral fin segments and vertical fin segments perpendicular to the lateral fin segments.

2. The apparatus of claim 1, wherein the at least one FET is a fin FET (FinFET) or a nanosheet FET.

3. The apparatus of claim 1, wherein the first omega-shaped portion and the second omega-shaped portion are modulated in opposite orientations.

4. The apparatus of claim 1, wherein the at least one FET is fabricated on a silicon (Si) semiconductor wafer or a silicon-germanium (SiGe) semiconductor wafer.

5. The apparatus of claim 1, wherein the at least one FET is an n-channel metal oxide semiconductor (NMOS) FET.

6. The apparatus of claim 1, wherein the at least one FET is a p-channel metal oxide semiconductor (PMOS) FET.

* * * * *